United States Patent
Nam et al.

(10) Patent No.: US 11,069,619 B2
(45) Date of Patent: Jul. 20, 2021

(54) INTERCONNECT STRUCTURE AND ELECTRONIC DEVICE EMPLOYING THE SAME

(71) Applicant: Samsung Electronics Co., Ltd., Suwon-si (KR)

(72) Inventors: Seunggeol Nam, Suwon-si (KR); Hyeonjin Shin, Suwon-si (KR); Keunwook Shin, Yongin-si (KR); Changhyun Kim, Seoul (KR); Kyung-Eun Byun, Seongnam-si (KR); Hyunjae Song, Hwaseong-si (KR); Eunkyu Lee, Yongin-si (KR); Changseok Lee, Seoul (KR); Alum Jung, Suwon-si (KR); Yeonchoo Cho, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 30 days.

(21) Appl. No.: 16/238,208

(22) Filed: Jan. 2, 2019

(65) Prior Publication Data

US 2020/0035602 A1 Jan. 30, 2020

(30) Foreign Application Priority Data

Jul. 26, 2018 (KR) .................. 10-2018-0087273

(51) Int. Cl.
*H01L 23/532* (2006.01)
*H01L 23/528* (2006.01)
*H01L 23/522* (2006.01)

(52) U.S. Cl.
CPC ........ *H01L 23/5329* (2013.01); *H01L 23/528* (2013.01); *H01L 23/5226* (2013.01); *H01L 23/53238* (2013.01); *H01L 23/53276* (2013.01)

(58) Field of Classification Search
CPC ............ H01L 23/5329; H01L 23/5226; H01L 23/53276; H01L 23/53238; H01L 23/528;
(Continued)

(56) References Cited

U.S. PATENT DOCUMENTS 9,761,532 B2  9/2017 Shin et al.
2012/0139114 A1  6/2012 Zhang et al.
(Continued)

FOREIGN PATENT DOCUMENTS

KR  10-2017-0037444 A  4/2017

OTHER PUBLICATIONS

Jeongmin Seo, Thin Solid Films, Adhesion Improvement of Graphene/Copper Interface Using UV/Ozone Treatments, vol. 584, No. 1, pp. 170-175, 2015.
Baozhen Li, Microelectronics Reliability, Electromigration Challenges for Advanced On-Chip Cu Interconnects, 54, 712 (2014).
M. W. Lane, Journal of Applied Physics, Relationship Between Interfacial Adhesion and Electromigration in Cu Metallization, 93, 1417 (2003).
(Continued)

*Primary Examiner* — Steven H Loke
*Assistant Examiner* — Juanita B Rhodes
(74) *Attorney, Agent, or Firm* — Harness, Dickey & Pierce, P.L.C.

(57) ABSTRACT

An interconnect structure and an electronic device including the interconnect structure are disclosed. The interconnect structure may include a metal interconnect having a bottom surface and two opposite side surfaces surrounded by a dielectric layer, a graphene layer on the metal interconnect, and a metal bonding layer providing interface adhesion between the metal interconnect and the graphene layer. The metal bonding layer includes a metal material.

11 Claims, 12 Drawing Sheets

(58) Field of Classification Search
CPC ......... H01L 21/76868; H01L 21/76846; H01L 21/76849
See application file for complete search history.

(56) References Cited

U.S. PATENT DOCUMENTS

| | | | | |
|---|---|---|---|---|
| 2013/0113102 | A1* | 5/2013 | Bao | H01L 21/76873 257/751 |
| 2014/0106561 | A1* | 4/2014 | Niyogi | H01L 21/76867 438/643 |
| 2014/0127896 | A1* | 5/2014 | Bonilla | H01L 21/76877 438/627 |
| 2014/0291819 | A1* | 10/2014 | Barth | H01L 23/53276 257/659 |
| 2017/0092592 | A1* | 3/2017 | Shin | H01L 21/28512 |
| 2018/0033734 | A1 | 2/2018 | Zhou | |

OTHER PUBLICATIONS

Chang Goo Kang, Nanotechnology, Effects of Multi-layer Graphene Capping on Cu Interconnects, 24 (2013) 115707.

C.-K. Hu, Applied Physics Letters, Comparison of Cu Electromigration Lifetime in Cu Interconnects Coated with Various Caps, 83, 869 (2003).

Ling Li, Beol Compatible Graphene/Cu with Improved Electromigration Lifetime for Future Interconnects, 2016 IEEE IEDM, 07838383 (2016).

James R. Lloyd, IEEE Transactions on Device and Materials Reliability, Electromigration and Adhesion, vol. 5, No. 1, pp. 113-118, 2002.

P. A. Khomyakov, First-Principles Study of the Interaction and Charge Transfer Between Graphene and Metals. B, 79, 195425 (2009).

* cited by examiner

INTERCONNECT STRUCTURE AND ELECTRONIC DEVICE EMPLOYING THE SAME

CROSS-REFERENCE TO RELATED APPLICATION

This application claims the benefit of Korean Patent Application No. 10-2018-0087273, filed on Jul. 26, 2018, in the Korean Intellectual Property Office, the disclosure of which is incorporated herein in its entirety by reference.

BACKGROUND

1. Field

The present disclosure relates to an interconnect structure and an electronic device employing the same, and more particularly, to an interconnect structure employing graphene and an electronic device employing the interconnect structure.

2. Description of Related Art

In semiconductor devices with high density and high performance, there have been continued efforts to reduce the width or the thickness of metal interconnects. When the width or the thickness of a metal interconnect is decreased, the number of semiconductor chips integrated on each wafer may be increased. In addition, when the thickness of a metal interconnect is decreased, capacitance of a line may be reduced, and thus, the speed of a signal passing through the interconnect may be increased.

However, resistance rapidly increases when the width or thickness of a metal interconnect is decreased, and thus, it is very important that the resistance of a metal interconnect is reduced. Currently, interconnect technology is approaching its physical limits since resistivity significantly increases as the width of the metal interconnect significantly decreases.

In addition, a decrease in the scale of a metal interconnect leads to an increase in current density of the metal interconnect, and the increase in current density of the metal interconnect may result in electro-migration in the metal interconnect. Electro-migration in a metal interconnect may result in defects, for example, an empty region in the metal interconnect.

SUMMARY

Provided is an interconnect, in which a graphene layer is used as a capping layer, and an electronic device employing the same. Adhesion between the graphene layer and a metal interconnect is increased to control electro-migration in the metal interconnect.

Additional aspects will be set forth in part in the description which follows and, in part, will be apparent from the description, or may be learned by practice of the presented embodiments.

According to an aspect of an embodiment, an interconnect structure includes a dielectric layer, a metal interconnect, a graphene layer, and a metal bonding layer. The metal interconnect includes a bottom surface, a first side, a second side opposite the first side, and a top surface. The bottom surface, the first side, and the second side of the metal interconnect are surrounded by the dielectric layer. The graphene layer is on at least the top surface of the metal interconnect. The metal bonding layer provides interfacial bonding between the metal interconnect and the graphene layer and including a metal material.

In some embodiments, the metal bonding layer may be configured to restrict electro-migration between the metal interconnect and the graphene layer.

In some embodiments, the metal bonding layer may include at least one of magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (w), iridium (Ir), platinum (Pt), gold (Au), bismuth (Bi), cobalt (Co), or ruthenium (Ru), or an alloy thereof.

In some embodiments, the interconnect structure may further include a barrier layer between the dielectric layer and the metal interconnect.

The barrier layer may include at least one of Mg, Al, Sc, Ti, V, Cr, Mn, Ni, Cu, Zn, Ga, Zr, Nb, Mo, Pd, Ag, Cd, In, Sn, La, Hf, Ta, W, Ir, Pt, Au, Bi, Co, or Ru, or an alloy thereof, or an oxide thereof, or a nitride thereof.

In some embodiments, the barrier layer may include a first barrier layer and a second barrier layer, wherein the first barrier layer may face the first side and the second side of the metal interconnect, and the second barrier layer may face the bottom surface of the metal interconnect.

In some embodiments, the graphene layer may face the bottom surface of the metal interconnect.

In some embodiments, the graphene layer may include a first graphene layer and second graphene layers. The first graphene layer may be on the top surface of the metal interconnect and the second graphene layers may be respectively located at the first side and the second side of the metal interconnect.

In some embodiments, the graphene layer may further include a third graphene layer on the bottom surface of the metal interconnect.

In some embodiments, the metal bonding layer may include a first bonding layer and a second bonding layer. The first bonding layer may be between the first graphene layer and the top surface of the metal interconnect, and the second bonding layers may be between the second graphene layers and the first side and the second side of the metal interconnect, respectively.

In some embodiments, the metal bonding layer may further include a third bonding layer between the third graphene layer and the bottom surface of the metal interconnect.

In some embodiments, the metal bonding layer may be located between the first graphene layer and the top surface of the metal interconnect.

In some embodiments, the metal bonding layer may be located between the third graphene layer and the bottom surface of the metal interconnect.

In some embodiments, the metal bonding layer may include second bonding layers and third bonding layers. The second bonding layers may be located between the second graphene layers and the first side and the second side of the metal interconnect, respectively, and the third bonding layer may be located between the third graphene layer and the bottom surface of the metal interconnect.

In some embodiments, the metal bonding layer may have a continuous thin film shape or an island shape that partially exists.

In some embodiments, the dielectric layer may further include silicon (Si) and at least one of hydrogen (H), oxygen (O), carbon (C), and nitrogen (N), or a combination thereof.

According to an aspect of another embodiment, an electronic device may include a device and an interconnect structure as described above connected to the device. The device may include at least one of a transistor, a capacitor, or a resistor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
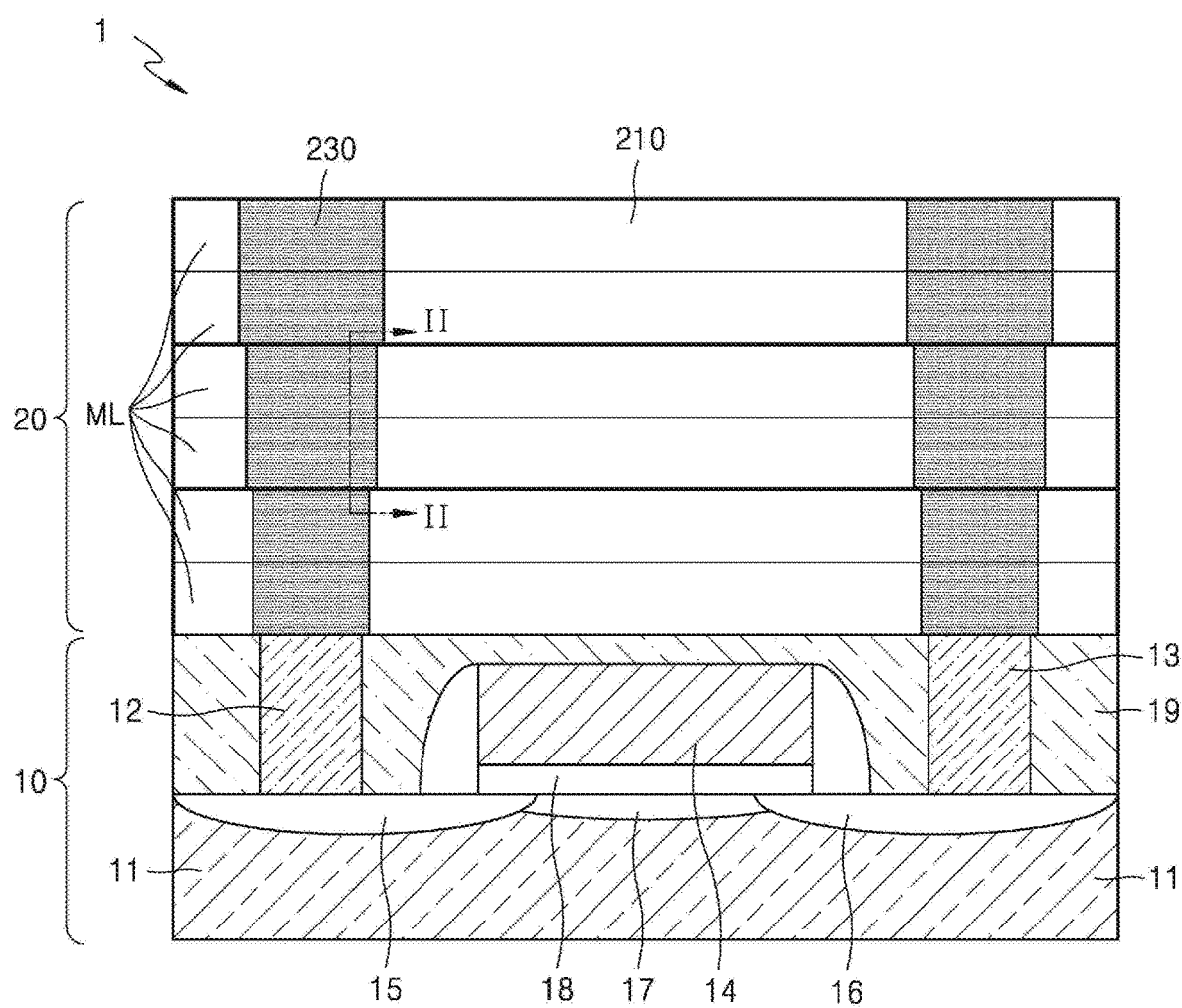
FIG. 1 is a cross-sectional view schematically illustrating an electronic device and an interconnect structure applied thereto, according to an embodiment.

Hereinafter, an interconnect structure and an electronic device employing the same, according to an embodiment, will be described in detail with reference to attached drawings. Throughout the drawings, the same drawing reference numerals will be understood to refer to the same elements, and the sizes or thicknesses of the elements may be exaggerated for convenience of explanation. Embodiments to be described hereinafter are just exemplary embodiments and there may be many kinds of modified embodiments based on the embodiments described hereinafter. Expressions such as "at least one of," when preceding a list of elements, modify the entire list of elements and do not modify the individual elements of the list.

Figure 1A:
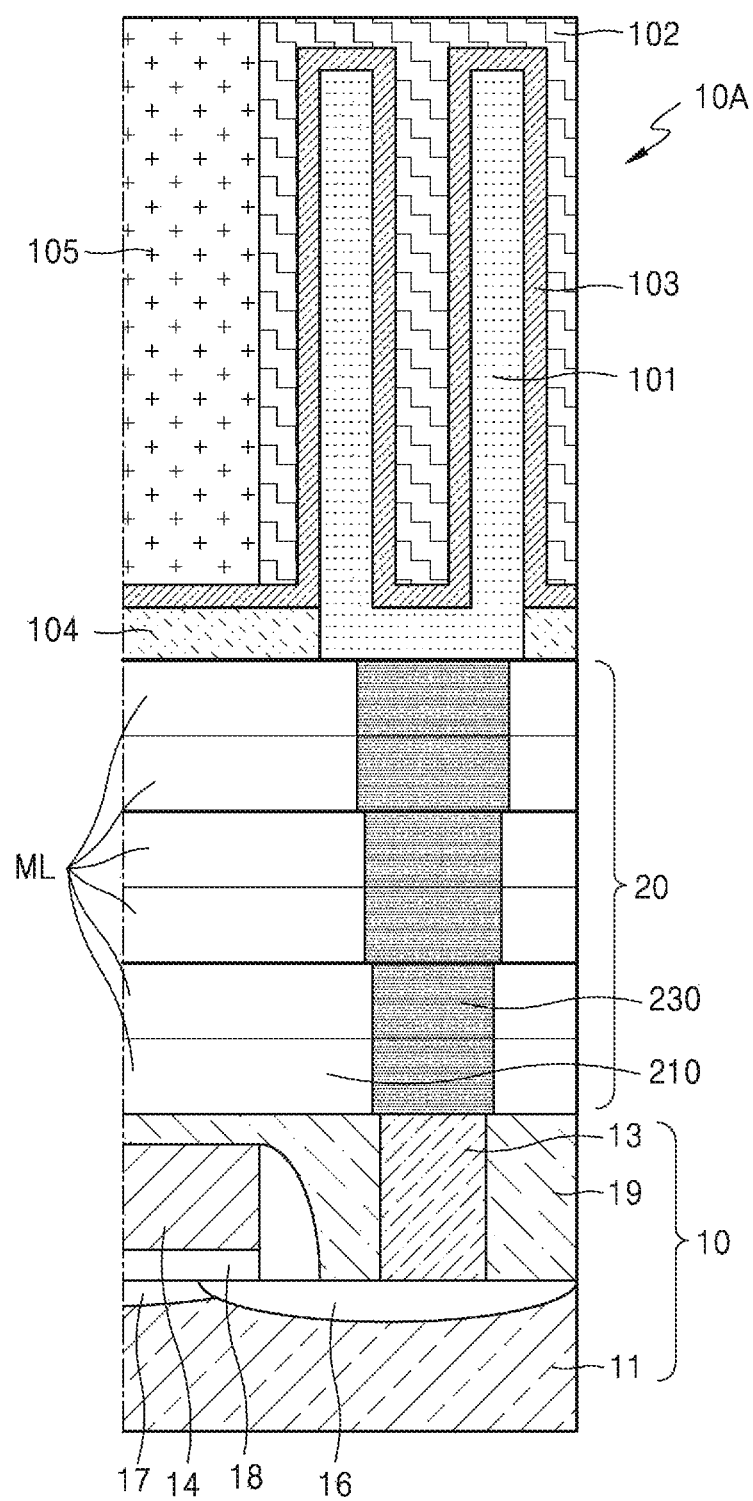
FIGS. 1A and 1B are a cross-sectional view schematically illustrating an electronic device and an interconnect structure applied thereto, according to other embodiments.
Figure 1B:
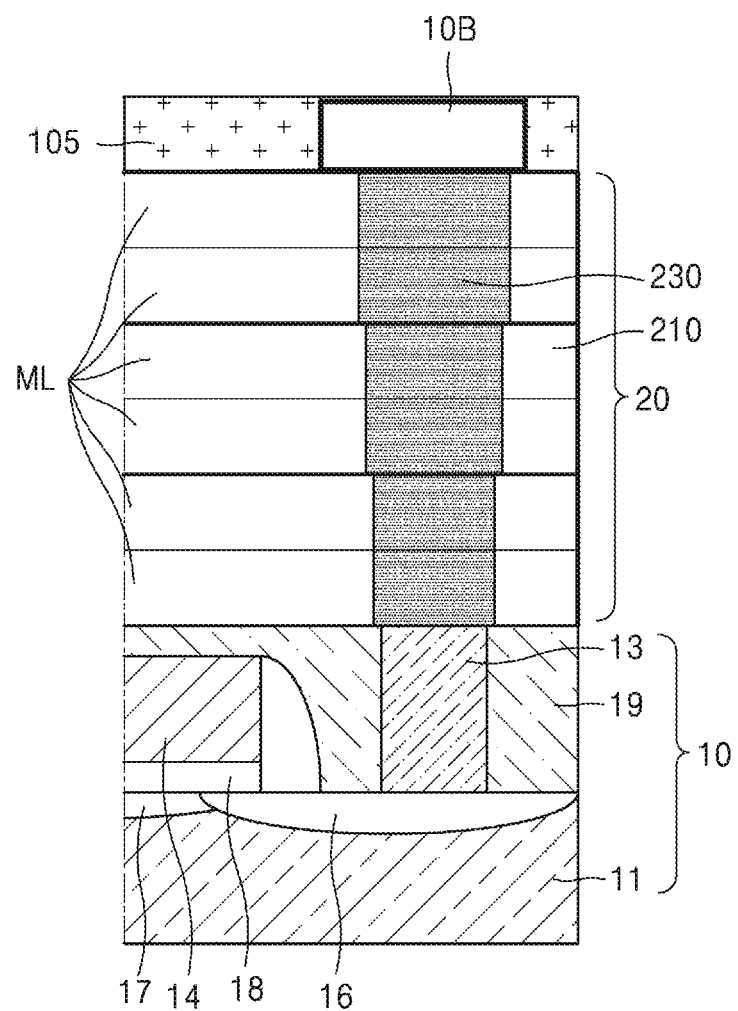

FIG. 1 is a cross-sectional view schematically illustrating an electronic device 1 and an interconnect structure 20 applied thereto, according to an embodiment. FIGS. 1A and 1B are a cross-sectional view schematically illustrating an electronic device 1 and an interconnect structure 20 applied thereto, according to other embodiments.

Referring to FIG. 1, the electronic device 1 includes a device 10 and the interconnect structure 20 that connects the device 10.

The device 10 may include at least one of a transistor, a capacitor, and a resistor.

The device 10 includes a first electrode 12 and a second electrode 13, which are respectively provided at two opposite sides of a substrate 11, and a gate electrode 14 that is placed between the first electrode 12 and the second electrode 13. A first region 15 may be formed at one side of a top surface of the substrate 11, and a second region 16 may be formed at another side of the top surface of the substrate 11. The first region 15 and the second region 16 may respectively be a source region and a drain region, or a drain region and a source drain region. A channel 17 may be formed between the first region 15 and the second region 16 on the top surface of the substrate 11. An insulating layer 18 may be placed between the channel 17 and the gate electrode 14. An insulating layer 19 may be placed between the first electrode 12, the second electrode 13, and the gate electrode 14.

The interconnect structure 20 may be placed on an upper region of the device 10. The interconnect structure 20 may have a structure in which a plurality of metallization layers (ML) are stacked. The metallization layer ML may include a metal interconnect 230 and a dielectric layer 210.

Although an example in which the device 10 is a transistor is mainly described in the above-described embodiment, the embodiment is not limited thereto, and the device 10 may also be a capacitor or a register.

As an example, referring to FIG. 1A, a capacitor 10A may be disposed on the interconnect structure 20, and the interconnect structure 20 and the capacitor 10A may be connected. The capacitor 10A may include a first electrode 101, a second electrode 102, and a dielectric layer 103 disposed between the first electrode 101 and the second electrode 102. The first electrode 101 may be connected to the metal interconnect 230 and the interlayer insulating film 104 may be disposed between the dielectric layer 210 and the dielectric layer 103. An insulating film 105 may be disposed on the dielectric layer 103.

As another example, referring to FIG. 1B, a resistor 10B may be disposed on the top of the interconnect structure 20, and the interconnect structure 20 and the resistor 10B may be connected. An insulating film 105 may be disposed around the resistor 10B.

Figure 2:
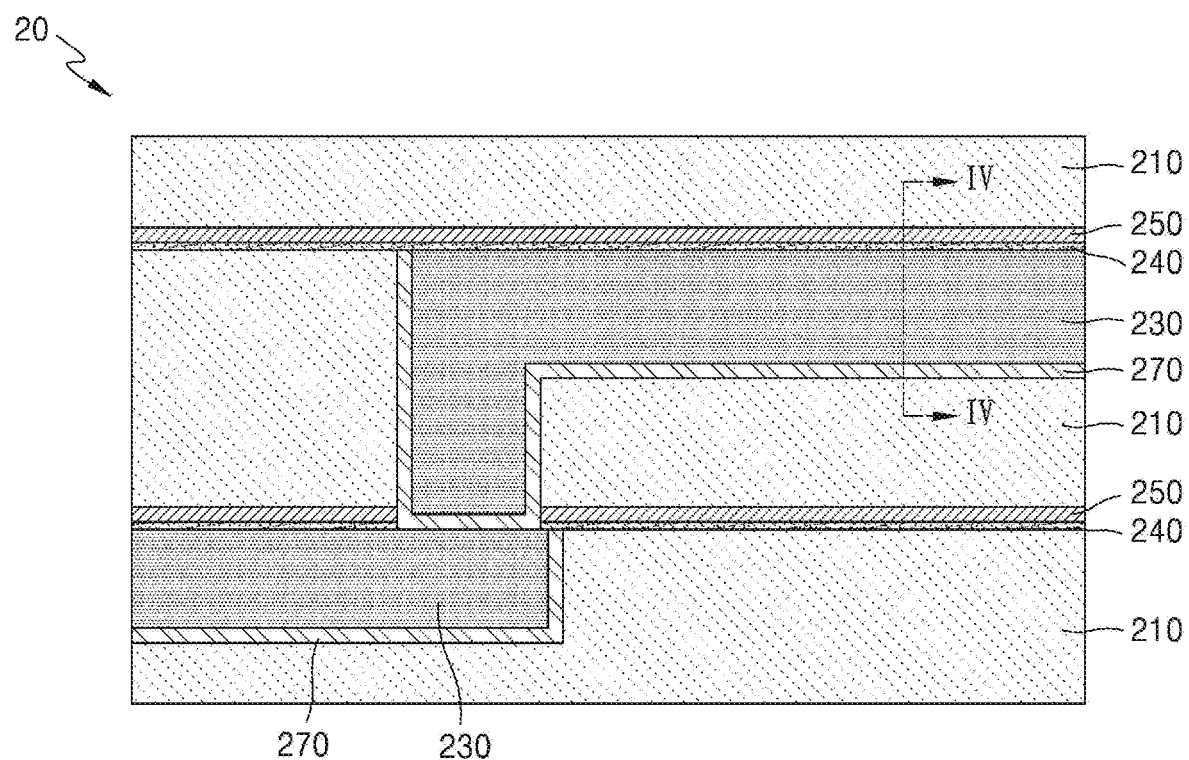
FIG. 2 is a cross-sectional view of the interconnect structure shown in FIG. 1 taken along line II-II.
Figure 3:
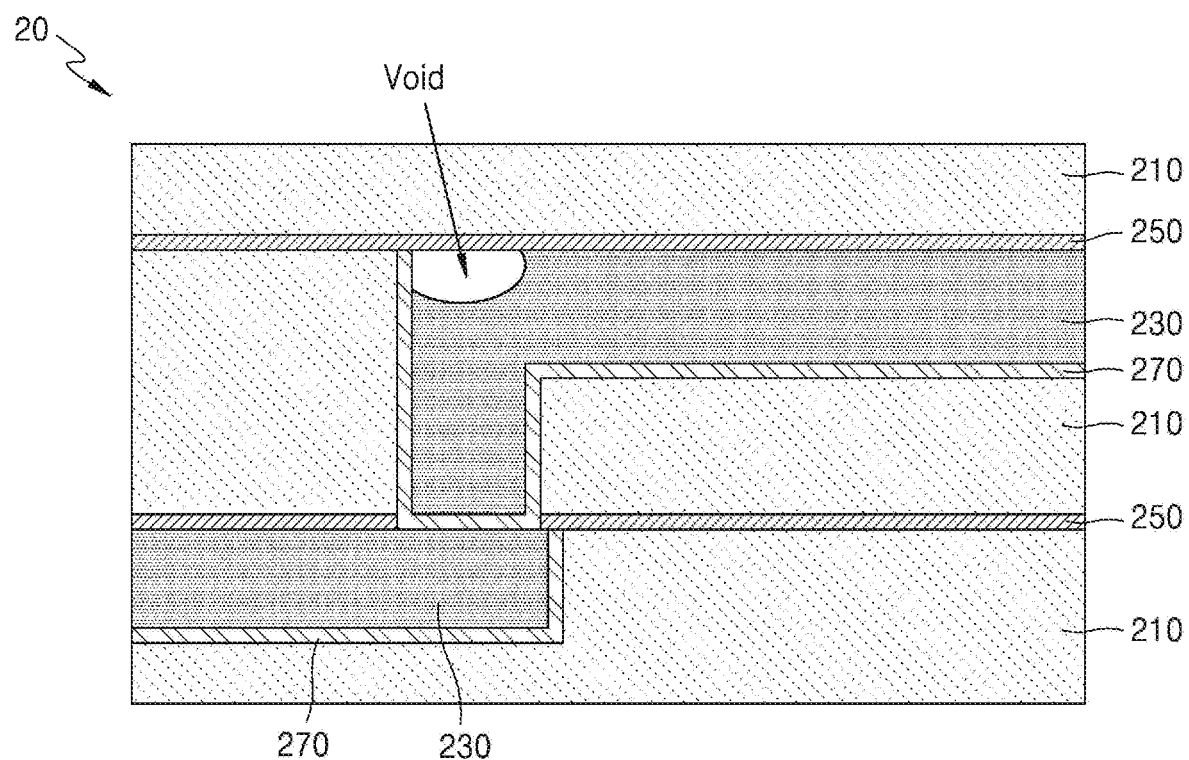
FIG. 3 is a cross-sectional view for describing a situation occurring in the metal interconnect when there is no metal bonding layer in the interconnect structure shown in FIG. 2.
Figure 4:
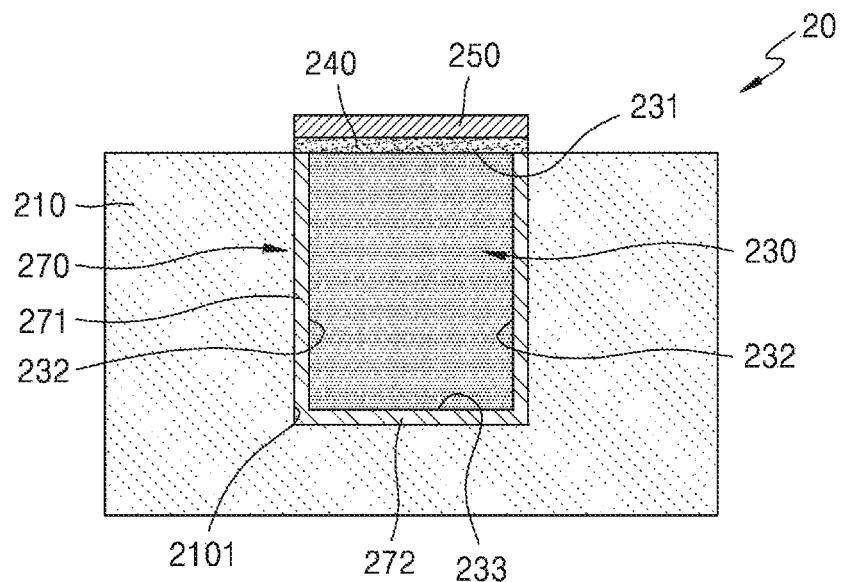
FIG. 4 is a cross-sectional view showing the interconnect structure in FIG. 2 taken along line IV-IV.

FIG. 2 is a cross-sectional view illustrating the interconnect structure 20, shown in FIG. 1, that is taken along line II-II. FIG. 3 is a block diagram for describing a situation occurring in the metal interconnect 230 when there is no metal bonding layer 240 in the interconnect structure 20 shown in FIG. 2. FIG. 4 is a cross-sectional view showing the interconnect structure 20, shown in FIG. 2, that is taken along line IV-IV.

Referring to FIGS. 1, 2, and 4, the interconnect structure 20 includes the dielectric layer 210, the metal interconnect 230, and a graphene layer 250. The interconnect structure 20 may further include a barrier layer 270.

At least one trench 2101, in which the metal interconnect 230 may be placed, may be formed on an upper region of the dielectric layer 210.

The dielectric layer 210 may include silicon (Si). The dielectric layer 210 may further include at least one element X in addition to Si. The element X may be either at least one of hydrogen (H), oxygen (O), carbon (C), nitrogen (N), or a combination thereof. For example, the dielectric layer 210 may include at least one of $SiO_2$, SiN, SiCHO, SiCN, SiON, and $Si_3N_4$.

The metal interconnect 230 may be placed in the trench 2101 in the dielectric layer 210. The material of the metal interconnect 230 may include copper (Cu). However, the material of the metal interconnect 230 is not limited thereto, and the metal interconnect may include another conductive material, for example, aluminum (Al).

A bottom surface 233 and two opposite sides 232 of the metal interconnect 230 may be placed to face the dielectric layer 210. The bottom surface 233 and the two opposite sides 232 of the metal interconnect 230 may be surrounded by the dielectric layer 210.

The barrier layer 270 may be placed between the metal interconnect 230 and the dielectric layer 210. The barrier layer 270 may include at least one of magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanium (La), hafnium (Hf), tantalum (Ta), tungsten (W), iridium (Ir), platinum (Pt), gold (Au), bismuth (Bi), cobalt (Co), and ruthenium (Ru), an alloy of the aforementioned metals, an oxide of the aforementioned metals, or a nitride of the aforementioned metals. For example, the barrier layer 270 may include Ta or Ti, aluminum oxide or titanium oxide, or titanium nitride, tantalum nitride, tungsten nitride, or aluminum nitride.

The barrier layer 270 may function as a diffusion prevention layer that limits and/or prevents the metal interconnect 230 from being diffused toward the dielectric layer 210.

The barrier layer 270 may include first barrier layers 271 that respectively face the two opposite sides 232 of the metal interconnect 230 and a second barrier layer 272 that faces the bottom surface 233 of the metal interconnect 230. In an operation of forming the metal interconnect 230, the barrier layer 270 may have a function of a frame for injecting a material included in the metal interconnect 230.

A graphene layer 250, which includes graphene, may be placed on a top surface 231 of the metal interconnect 230. As the graphene layer 250 is placed on the top surface 231 of the metal interconnect 230, electro-migration in the metal interconnect 230 may be restricted or suppressed. The graphene layer 250 may function as a capping layer of the metal interconnect 230.

However, as shown in FIG. 3, when the graphene layer 250 is directly formed on the top surface 231 of the metal interconnect 230, interaction occurring at an interface between the graphene layer 250 and the metal interconnect 230 is not very active, and therefore, it may be difficult to control electro-migration in the metal interconnect 230 as wanted. Accordingly, due to the electro-migration in the metal interconnect 230, a void may be formed at the interface between the metal interconnect 230 and the graphene layer 250, and thus, electro migration failure time may be reduced.

Considering the aforementioned issue, the interconnect structure 20 according to the embodiment may further include a metal bonding layer 240 between the metal interconnect 230 and the graphene layer 250. As the metal bonding layer 240 provides interfacial bonding between the metal interconnect 230 and the graphene layer 250, electromigration between the metal interconnect 230 and the graphene layer 250 may be restricted.

The metal bonding layer 240 may form a carbide bond at an interface between the metal bonding layer 240 and the graphene layer 250. To form the carbide bond at the interface between the metal bonding layer 240 and the graphene layer 250, the metal bonding layer 240 may include at least one of Mg, Al, Sc, Ti, V, Cr, Mn, Ni, Cu, Zn, Ga, Zr, Nb, Mo, Pd, Ag, Cd, In, Sn, La, Hf, Ta, W, Ir, Pt, Au, Bi, Co, and Ru, or an alloy of one or more of the aforementioned metals.

The metal bonding layer 240 and the graphene layer 250 may function as diffusion barriers of the metal interconnect 230.

Meanwhile, in the interconnect structure 20 according to the above-described embodiment, an example in which the graphene layer 250 and the metal bonding layer 240 are placed on the top surface 231 of the metal interconnect 230 is mainly described. However, the arrangement of the graphene layer 250 and the metal bonding layer 240 is not limited thereto, and the graphene layer 250 and the metal bonding layer 240 may be variously placed.

FIGS. 5 through 11 are block diagrams respectively illustrating interconnect structures 20A through 20G according to other embodiments.

Figure 5:
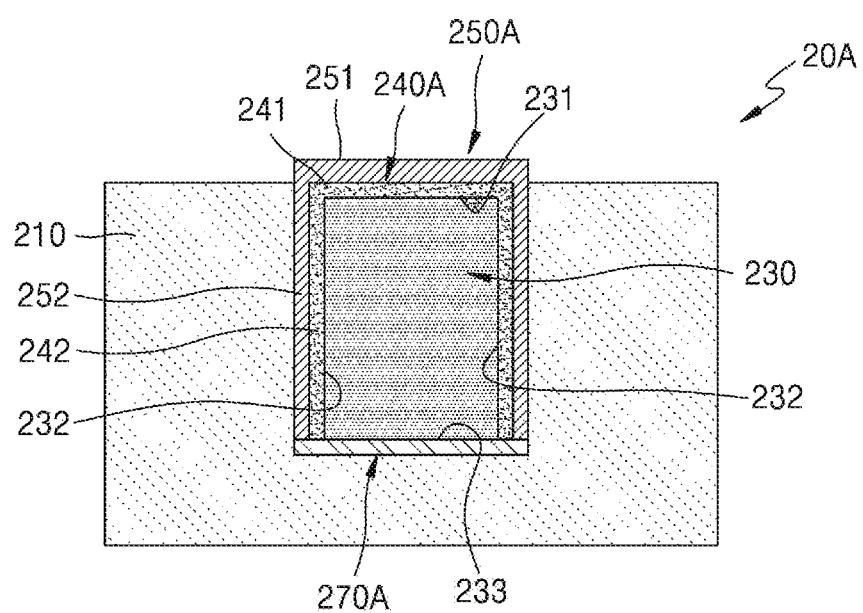
FIGS. 5 through 11 are cross-sectional views respectively showing interconnect structures according to other embodiments.

Referring to FIG. 5, in an interconnect structure 20A according to an embodiment, a graphene layer 250 may be placed not only on the top surface 231 of the metal interconnect 230 but also at the two opposite sides 232 of the metal interconnect 230. For example, the graphene layer 250A may include a first graphene layer 251 placed on the top surface 231 of the metal interconnect 230 and second graphene layers 252 placed at the two opposite sides 232 of the metal interconnect 230. The second graphene layers 252 may, from the first graphene layer 251, extend in a direction that is perpendicular to a direction in which the first graphene layer 251 extends.

A metal bonding layer 240A may include a first bonding layer 241 that is placed between the first graphene layer 251 and the top surface 231 of the metal interconnect 230, and a pair of second bonding layers 242 placed between the second graphene layers 252 and the two opposite sides 232 of the metal interconnect 230.

The second graphene layers 252 and the second bonding layers 242 may limit and/or prevent diffusion from the two opposite sides 232 of the metal interconnect 230 to the dielectric layer 210. In this case, the barrier layer 270 may be placed to face the bottom surface 233 of the metal interconnect 230 instead of being placed at the two opposite sides 232 of the metal interconnect 230.

Figure 6:
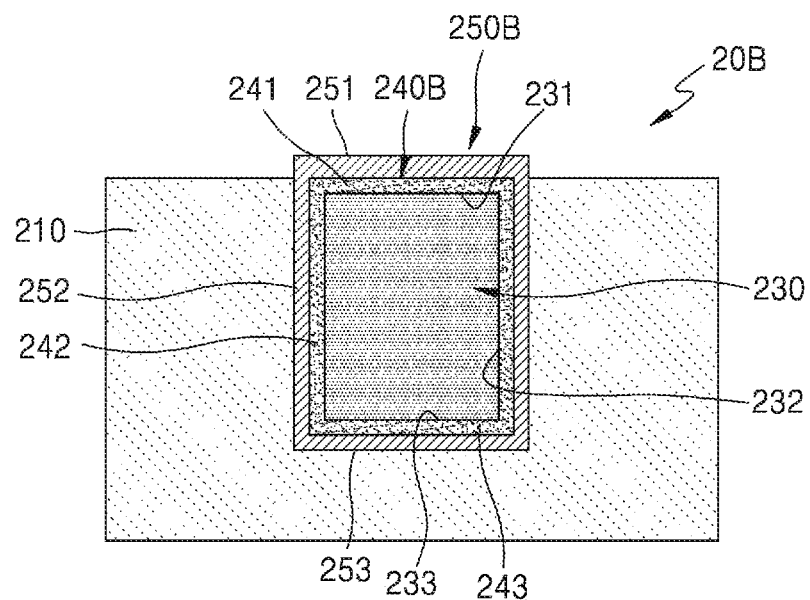

Referring to FIG. 6, in an interconnect structure 20B according to another embodiment, a graphene layer 250B may be on the top surface 231, the two opposite sides 232, and the bottom surface 233 of the metal interconnect 230. For example, the graphene layer 250B may include the first graphene layer 251, the second graphene layers 252, and a third graphene layer 253 that is on the bottom surface 233 of the metal interconnect 230.

A metal bonding layer 240B may include the first bonding layer 241, the second bonding layers 242, and a third bonding layer 243 placed between the third graphene layer 253 and the bottom surface 233 of the metal interconnect 230.

The third graphene layer 253 and the third bonding layer 243 may prevent diffusion from the bottom surface 233 of the metal interconnect 230 to the dielectric layer 210. In this case, the barrier layer 270 may not be provided.

Referring to FIGS. 7 to 10, in interconnect structures 20C, 20D, 20E, and 20F according to other embodiments, metal bonding layers 240A, 240C, and 240D may be placed in some regions between a graphene layer 250B and the metal interconnect 230 and may not be placed in remaining regions between the graphene layer 250B and the metal interconnect 230.

Figure 7:
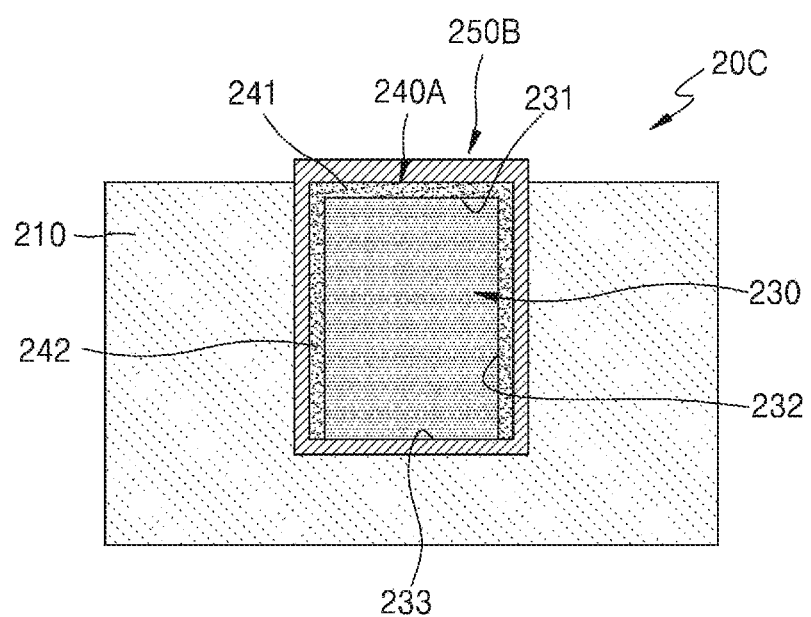

For example, as shown in FIG. 7, the metal bonding layer 240A may be placed between the graphene layer 250B, the top surface 231, and the two opposite sides 232 of the metal interconnect 230 and not be placed between the graphene layer 250B and the bottom surface 233 of the metal interconnect 230.

Figure 8:
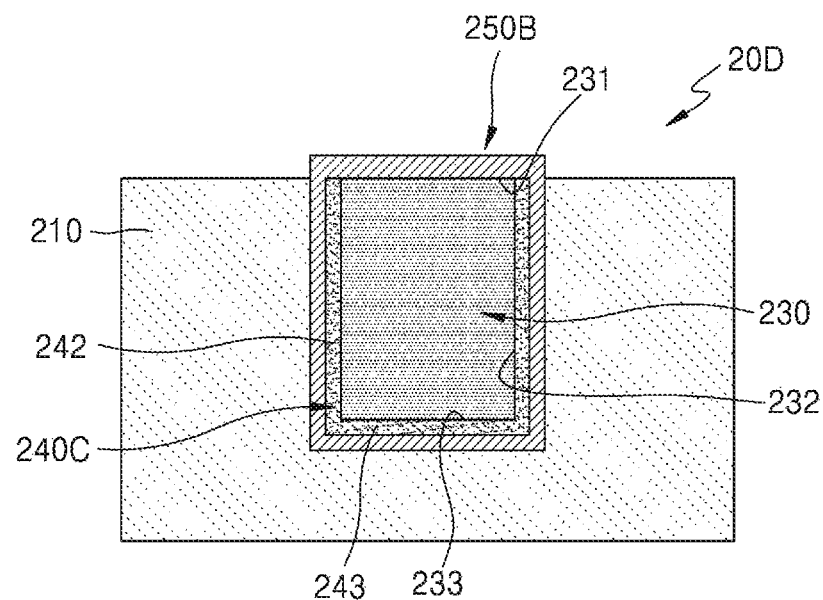

For example, as shown in FIG. 8, the metal bonding layer 240C may be placed between the graphene layer 250B, the bottom surface 233, and the two opposite sides 232 of the metal interconnect 230 and not be placed between the graphene layer 250B and the top surface 231 of the metal interconnect 230.

Figure 9:
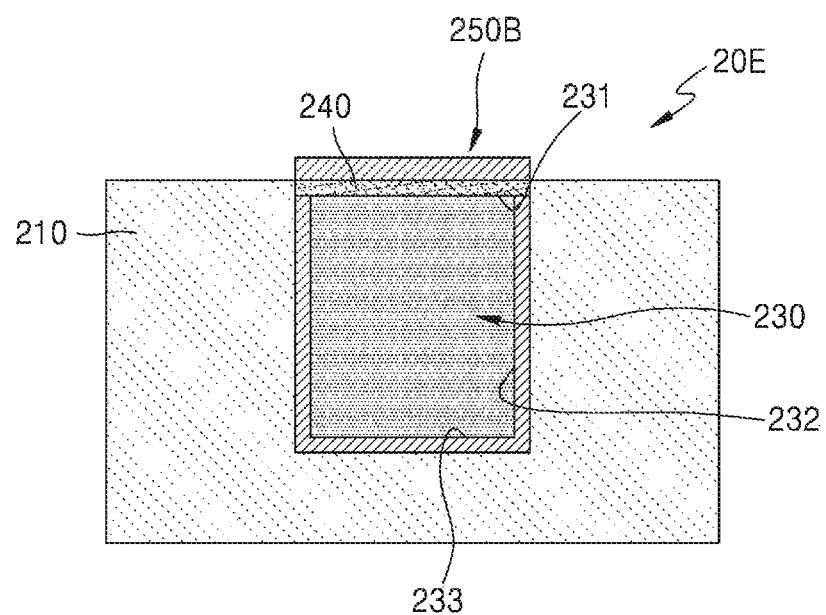

For example, as shown in FIG. 9, the metal bonding layer 240 may be placed between the graphene layer 250B and the top surface 231 of the metal interconnect 230 and not be placed between the graphene layer 250B and the two opposite sides 232 and the bottom surface 233 of the metal interconnect 230.

Figure 10:
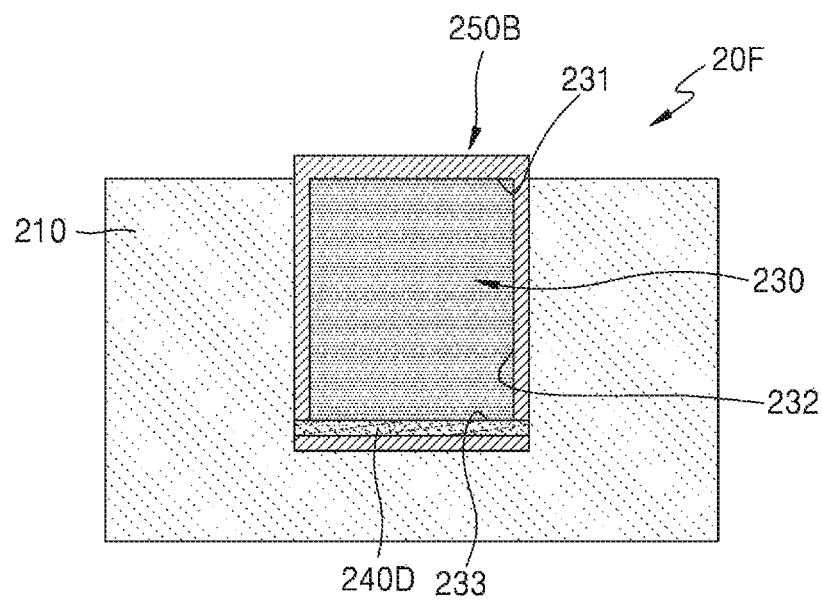

For example, as shown in FIG. 10, the metal bonding layer 240D may be placed between the graphene layer 250B and the bottom surface 233 of the metal interconnect 230 and not be placed between the graphene layer 250B, the opposite sides 232, and the top surface 231 of the metal interconnect 230.

Figure 11:
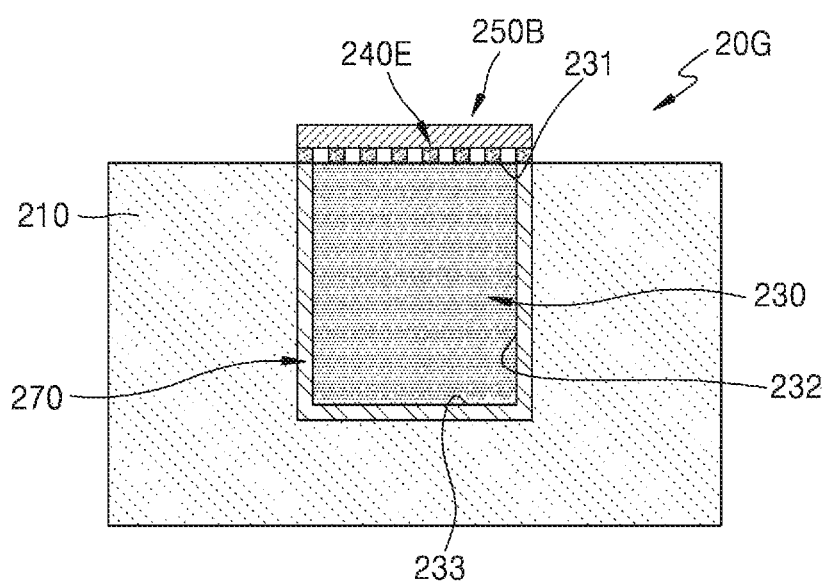

Meanwhile, as shown in FIGS. 4 to 10, each of the metal bonding layers 240, 240A, 240B, 240C, and 240D may be formed into a continuous thin film between the metal interconnect 230 and each of the graphene layers 250, 250A, and 250B. However, as shown in FIG. 11, the metal bonding layer 240E in the interconnect structure 20G may have the form of partially existing islands.

FIGS. 12A through 12E are block diagrams for describing a method of manufacturing the interconnect structure 20 according to an embodiment.

Figure 12A:
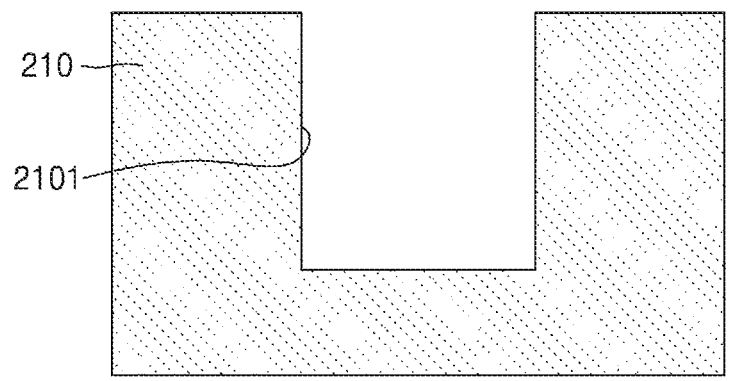
FIGS. 12A through 12E are cross-sectional views for describing a method of manufacturing an interconnect structure, according to an embodiment.

Referring to FIG. 12A, the dielectric layer 210, in which the trench 2101 is formed, is prepared. The dielectric layer 210 may include Si. The dielectric layer 210 may further include at least one element X in addition to Si. The element X may be at least one of H, O, C, N, or combinations thereof. For example, the dielectric layer 210 may include at least one of $SiO_2$, SiN, SiCHO, SiCN, SiON, and $Si_3N_4$. A width and a height of the trench 2101 may be greater than a width and a height of the metal interconnect 230.

Figure 12B:
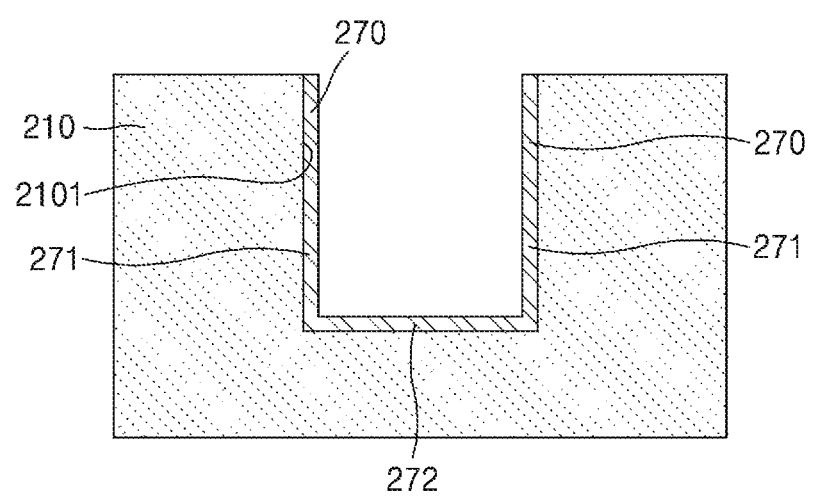

Referring to FIG. 12B, the barrier layer 270 is formed in the trench 2101 in the dielectric layer 210. The barrier layer 270 includes the first barrier layers 271 respectively formed at two opposite sides of the trench 2101 and the second barrier layer 272 formed at a bottom surface of the trench 2101. The barrier layer 270 may include at least one of Mg, Al, Sc, Ti, V, Cr, Mn, Ni, Cu, Zn, Ga, Zr, Nb, Mo, Pd, Ag, Cd, In, Sn, La, Hf, Ta, W, Ir, Pt, Au, Bi, Co and Ru, alloys of the aforementioned metals, oxides of the aforementioned metals, or nitrides of the aforementioned metals. For example, the barrier layer 270 may include Ta or Ti, aluminum oxide, titanium oxide, titanium nitride, tantalum nitride, tungsten nitride, or aluminum nitride.

The barrier layer 270 may have a function of a diffusion prevention layer that limits and/or prevents the metal interconnect 230 from diffusing toward the dielectric layer 210.

Figure 12C:
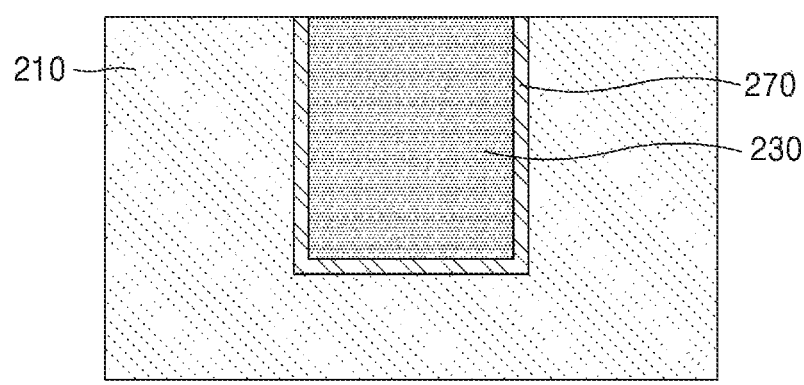

Referring to FIG. 12C, the metal interconnect 230 is formed in the trench 2101, in which the barrier layer 270 is formed, in the dielectric layer 210. The material of the metal interconnect 230 may include Cu. However, the material of the metal interconnect 230 is not limited thereto and the metal interconnect 230 may include another conductive material, for example, aluminum.

The barrier layer 270, which includes the first barrier layers 271 and the second barrier layer 272, may function as a frame for injecting the material included in the metal interconnect 230. The metal interconnect 230 may have a shape that corresponds to a shape of the barrier layer 270.

Figure 12D:
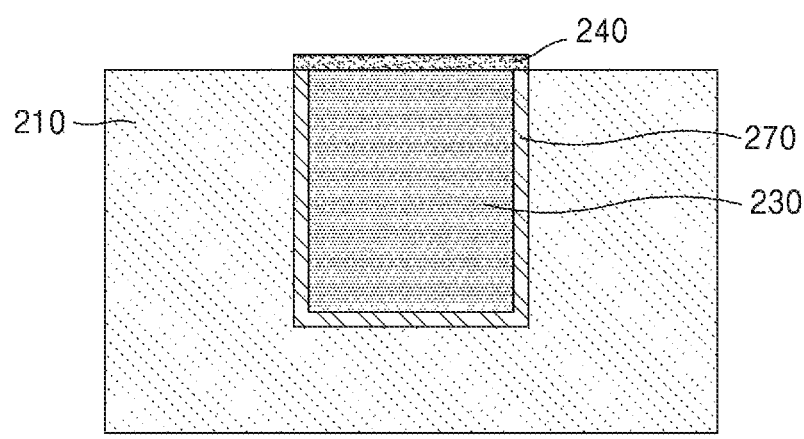

Referring to FIG. 12D, the metal bonding layer 240 is deposited on the top surface 231 of the metal interconnect 230. Adhesion between the metal interconnect 230 and the metal bonding layer 240 is greater than adhesion between the metal interconnect 230 and the graphene layer 250 when the graphene layer 250 is directly deposited on the metal interconnect 230.

The metal bonding layer 240 may include at least one of Mg, Al, Sc, Ti, V, Cr, Mn, Ni, Cu, Zn, Ga, Zr, Nb, Mo, Pd, Ag, Cd, In, Sn, La, Hf, Ta, W, Ir, Pt, Au, Bi, Co, and Ru, alloys of the aforementioned metals, oxides of the aforementioned metals, or nitrides of the aforementioned metals.

Figure 12E:
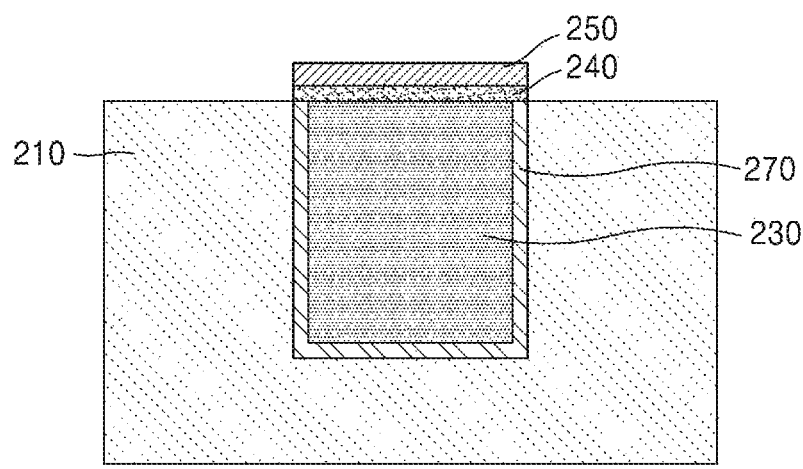

Referring to FIG. 12E, the graphene layer 250 is deposited on a top surface of the metal bonding layer 240. As the graphene layer 250 is deposited on the top surface of the metal bonding layer 240, a carbide bond may be formed at an interface between the metal bonding layer 240 and the graphene layer 250. Cohesion between the metal bonding layer 240 and the graphene layer 250 is greater than cohesion between the metal interconnect 230 and the graphene layer 250 when the graphene layer 250 is directly deposited on the metal interconnect 230.

Meanwhile, in FIGS. 12A to 12E, a method of manufacturing the interconnect structure 20 disclosed in FIG. 4 or 11 is mainly described. Although it is not shown in the drawings, the method disclosed in FIGS. 12A through 12E may be, similarly or after appropriate modifications, applied to the method of manufacturing the interconnect structure 20 that is disclosed in FIGS. 5 through 10.

For example, in the interconnect structure 20A shown in FIG. 5, after only a barrier layer 270A at the bottom surface of the dielectric layer 210 in which the trench 2101 is formed, the metal interconnect 230, in which the metal bonding layer 240A and the graphene layer 250A are respectively deposited on the top surface 231 and at the two opposite sides 232, may be inserted into the trench 2101 in the dielectric layer 210.

For example, in the interconnect structure 20B (see FIG. 6), the metal interconnect 230, in which the metal bonding layer 240B and the graphene layer 250B are deposited above the top surface 231, under the bottom surface 233, and at the two opposite sides 232, may be inserted into the trench 2101 in the dielectric layer 210.

For example, in the interconnect structure 20C shown in FIG. 7, the metal bonding layer 240A is deposited at the two opposite sides 232 and the top surface 231 of the metal interconnect 230, and the graphene layer 250B is deposited under the bottom surface 233 of the metal interconnect 230B, at two opposite sides of the metal bonding layer 240A, and on the top surface of the metal bonding layer 240A. The metal interconnect 230, on which the metal bonding layer 240A and the graphene layer 250B are deposited, may be inserted into the trench 2101 in the dielectric layer 210.

For example, in the interconnect structure 20D shown in FIG. 8, the metal bonding layer 240C is deposited at the two opposite sides 232 and the bottom surface 233 of the metal interconnect 230, and the graphene layer 250B is deposited on the top surface 231 of the metal interconnect 230, at the two opposite sides of the metal bonding layer 240C, and under the bottom surface of the metal bonding layer 240C. The metal interconnect 230, on which the metal bonding layer 240C and the graphene layer 250B is deposited, may be inserted into the trench 2101 in the dielectric layer 210.

For example, in the interconnect structure 20E shown in FIG. 9, the metal bonding layer 240 is deposited on the top surface 231 of the metal interconnect 230, and the graphene layer 250B is deposited at the two opposite sides 232 of the metal interconnect 230, under the bottom surface 233 of the metal interconnect 230, and on the top surface of the metal bonding layer 240. The metal interconnect 230, on which the metal bonding layer 240 and the graphene layer 250b is deposited, may be inserted into the trench 2101 in the dielectric layer 210.

For example, in the interconnect structure 20F shown in FIG. 10, the metal bonding layer 240D is deposited under the bottom surface 233 of the metal interconnect 230, and the graphene layer 250B is deposited at the two opposite sides 232 of the metal interconnect 230, on the top surface 231 of the metal interconnect 230, and under the bottom surface of the metal bonding layer 240D. The metal interconnect 230, on which the metal bonding layer 240D and the graphene layer 250B are deposited, may be inserted into the trench 2101 in the dielectric layer 210.

The interconnect structure and the electric device employing the same according to the embodiments may, in the interconnect structure in which the graphene layer is used as the capping layer, enhance adhesion between the graphene layer and the metal interconnect such that the electromigration of the metal interconnect is controlled.

The interconnect structure and the electric device including the same have been described in the embodiments and shown in the attached drawings such that the present disclosure may be more clearly and thoroughly understood. However, the embodiments are merely used as examples of the present disclosure and the present disclosure is not limited thereto. In addition, it will be understood that the present disclosure is not limited to the embodiments that are shown and described, for various changes in forms and details may be made therein by one of ordinary skill in the art.

What is claimed is:

1. An interconnect structure comprising:
a dielectric layer;
a metal interconnect having a bottom surface, a first side, a second side opposite the first side, and a top surface, the bottom surface, the first side, and the second side of the metal interconnect being surrounded by the dielectric layer;
a graphene layer on at least the top surface of the metal interconnect; and
a metal bonding layer providing interfacial bonding between the metal interconnect and the graphene layer, the metal bonding layer including a metal material,
wherein the graphene layer includes a first graphene layer on the top surface of the metal interconnect, second graphene layers on the first side and the second side of the metal interconnect, and a third graphene layer on the bottom surface of the metal interconnect, and
wherein the metal bonding layer is between the third graphene layer and the bottom surface of the metal interconnect.

2. The interconnect structure of claim 1, wherein
the metal bonding layer is configured to restrict electromigration between the metal interconnect and the graphene layer.

3. The interconnect structure of claim 2, wherein
the metal bonding layer includes at least one of magnesium (Mg), aluminum (Al), scandium (Sc), titanium (Ti), vanadium ( ), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanium (La), hafnium (Hf), tantalum (Ta), tungsten (W), iridium (Ir), platinum (Pt), gold (Au), bismuth (Bi), cobalt (Co), or ruthenium (Ru), or an alloy thereof.

4. The interconnect structure of claim 2, wherein
the metal bonding layer has a continuous thin film shape or an island shape that partially exists.

5. The interconnect structure of claim 1, wherein
the metal bonding layer further includes a first bonding layer and second bonding layers,
the first bonding layer is between the first graphene layer and the top surface of the metal interconnect; and
the second bonding layers are between the second graphene layers and the first side and the second side of the metal interconnect, respectively.

6. The interconnect structure of claim 1, wherein
the metal bonding layer is between the first graphene layer and the top surface of the metal interconnect.

7. The interconnect structure of claim 1, wherein
the dielectric layer further includes silicon (Si) and at least one of hydrogen (H), oxygen (O), carbon (C), nitrogen (N), or a combination thereof.

8. An electronic device comprising:
a device including at least one of a transistor, a capacitor, or a resistor; and
the interconnect structure of claim 1 connected to the device.

9. The interconnect structure of claim 1, wherein
the metal bonding layer provides interfacial bonding between the top surface of the metal interconnect and a portion of the first graphene layer on a top surface of the metal bonding layer.

10. An interconnect structure comprising:
a dielectric layer;
a metal interconnect having a bottom surface, a first side, a second side opposite the first side, and a top surface, the bottom surface the first side and the second side of the metal interconnect being surrounded by the dielectric layer;
a graphene layer on at least the top surface of the metal interconnect; and
a metal bonding layer providing interfacial bonding between the metal interconnect and the graphene layer, the metal bonding layer including a metal material,
wherein the graphene layer includes a first graphene layer on the top surface of the metal interconnect, second graphene layers on the first side and the second side of the metal interconnect, and a third graphene layer on the bottom surface of the metal interconnect, and
wherein the metal bonding layer includes a first bonding layer, second bonding layers and a third bonding layer,
the first bonding layer is between the first graphene layer and the top surface of the metal interconnect;
the second bonding layers are between the second graphene layers and the first side and the second side of the metal interconnect, respectively; and
wherein the third bonding layer is between the third graphene layer and the bottom surface of the metal interconnect.

11. An interconnect structure comprising:
a dielectric layer;
a metal interconnect having a bottom surface, a first side, a second side opposite the first side, and a toy surface, the bottom surface, the first side, and the second side of the metal interconnect being surrounded by the dielectric layer;
a graphene layer on at least the toy surface of the metal interconnect; and
a metal bonding layer providing interfacial bonding between the metal interconnect and the graphene layer, the metal bonding layer including a metal material, wherein
the graphene layer includes a first graphene layer on the top surface of the metal interconnect, second graphene layers on the first side and the second side of the metal interconnect, and a third graphene layer on the bottom surface of the metal interconnect, and wherein the metal bonding layer includes a first bonding layer, second bonding layers, and a third bonding layer, the second bonding layers are between the second graphene layers and the first side and the second side of the metal interconnect, respectively, and the third bonding layer is between the third graphene layer and the bottom surface of the metal interconnect.

* * * * *